(12) United States Patent
Li et al.

(10) Patent No.: US 10,373,888 B2
(45) Date of Patent: Aug. 6, 2019

(54) ELECTRONIC PACKAGE ASSEMBLY WITH COMPACT DIE PLACEMENT

(71) Applicant: Intel Corporation, Santa Clara, CA (US)

(72) Inventors: Eric J. Li, Chandler, AZ (US); Vipul V. Mehta, Chandler, AZ (US); Digvijay A. Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/395,985

(22) Filed: Dec. 30, 2016

(65) Prior Publication Data

US 2018/0190560 A1   Jul. 5, 2018

(51) Int. Cl.
*H01L 21/56* (2006.01)
*H01L 23/00* (2006.01)
(Continued)

(52) U.S. Cl.
CPC ........ *H01L 23/3135* (2013.01); *H01L 21/563* (2013.01); *H01L 23/3121* (2013.01); *H01L 23/3142* (2013.01); *H01L 24/17* (2013.01); *H01L 24/81* (2013.01); *H01L 25/0655* (2013.01); *H01L 2224/16113* (2013.01); *H01L 2224/16225* (2013.01); *H01L 2924/1304* (2013.01); *H01L 2924/1815* (2013.01)

(58) Field of Classification Search
CPC ............... H01L 21/563; H01L 23/3135; H01L 2224/16225; H01L 25/0655; H01L 23/3142; H01L 23/3121; H01L 2224/16153; H01L 2924/1304; H01L 2924/1815; H01L 23/28; H01L 23/3185; H01L 24/17; H01L 24/81; H01L 2224/1635; H01L 2224/16137; H01L 2224/16113
See application file for complete search history.

(56) References Cited

U.S. PATENT DOCUMENTS 9,040,349 B2 *   5/2015   Kelly ..................... H01L 24/81
                                                          438/109
2013/0200529 A1   8/2013   Lin et al.
(Continued)

OTHER PUBLICATIONS

International search report dated Mar. 6, 2018, in International Application No. PCT/US18/12028, filed Jan. 2, 2018; 5 pages.

*Primary Examiner* — Jasmine J Clark
(74) *Attorney, Agent, or Firm* — Thorpe North & Western, LLP; David W. Osborne

(57) ABSTRACT

An electronic package assembly is disclosed. A substrate can have an upper surface area. A first active die can have an upper surface area and a bottom surface, the bottom surface operably coupled to the substrate. A second active die can have an upper surface area and a bottom surface, the bottom surface operably coupled to the substrate. A capillary underfill material can at least partially encapsulate the bottom surface of the first active die and the second active die and extend upwardly upon inside side surfaces of the first and second active dies. A combined area of the upper surface area of the first active die and an upper surface area of the second active die is at least about 90% of the upper surface area of the substrate.

13 Claims, 5 Drawing Sheets

(51) Int. Cl.
*H01L 23/31* (2006.01)
*H01L 25/065* (2006.01)

(56) References Cited

U.S. PATENT DOCUMENTS

2015/0255426 A1* 9/2015 Son .................... H01L 21/6835
                                                    257/738
2017/0062370 A1* 3/2017 Shiraki .................. H01L 24/16

* cited by examiner ced in the case of multiple top dies with narrow die to die spacing because of the so-called "keep-out zone" ("KOZ") limitation of other underfill technologies such as dispensed epoxy flux or epoxy flux film. These technologies can require a greater KOZ than is desired for small die spacing.

ELECTRONIC PACKAGE ASSEMBLY WITH COMPACT DIE PLACEMENT

TECHNICAL FIELD

Embodiments described herein relate generally to electronic package assemblies, and more particularly to electronic package assemblies having compact die placement atop a substrate.

BACKGROUND

In conventional semiconductor packages that utilize 3D die stacking, the interconnect between the top and the bottom die usually has a very fine pitch on the order of 50 um or less. Due to this, an "underfill" material is used to protect the micro-solder joints in downstream assembly processes and in reliability testing. Capillary underfill ("CUF") is one of the options used to accomplish this. It can be desirable to use CUF technology in the case of multiple top dies with narrow die to die spacing because of the so-called "keep-out zone" ("KOZ") limitation of other underfill technologies such as dispensed epoxy flux or epoxy flux film. These technologies can require a greater KOZ than is desired for small die spacing.

Despite these advantages, however, CUF technology is limited by finite dispensing dot size and placement accuracy. As a result, a KOZ between the top die edge and the bottom die edge on the order of 500 um is usually required. In many application cases, however, the total die area of the top die is very close to the bottom die area, leaving very little space (e.g., 100 um or less) between the top and the bottom die edges. Dispense dot size reduction and equipment alignment accuracy improvement can help to reduce the size of the dispense KOZ. However, the run rate will be significantly lower because the same amount of underfill material is still needed and equipment upgrade is costly.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
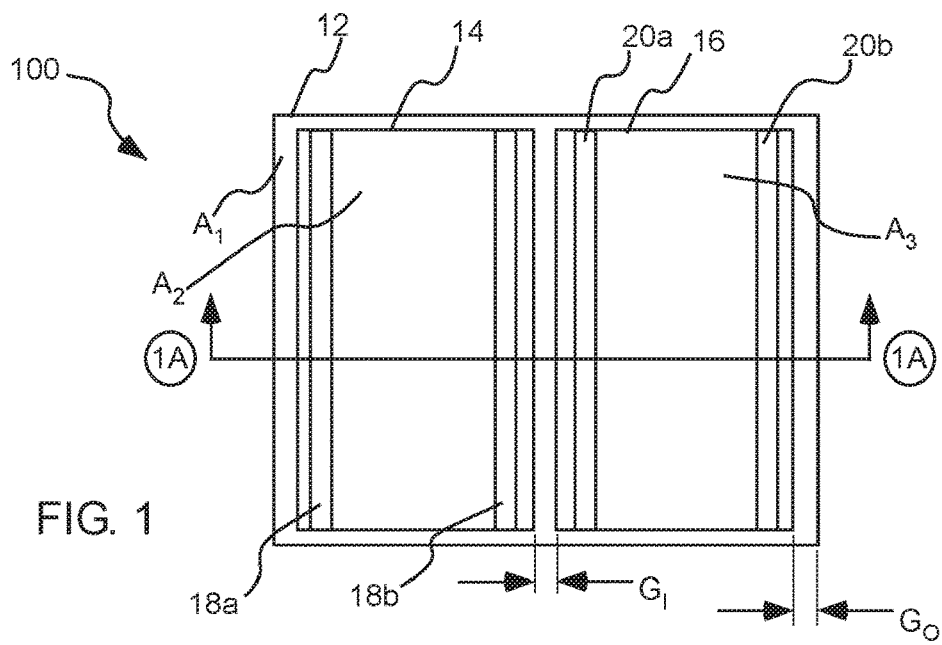
FIG. 1 is a top view of an electronic package assembly that will be used in further processing in accordance with an example embodiment.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes support for a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects or items are in physical contact and attached to one another. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

The use of CUF is advantageous for the protection of delicate micro-solder joints expected to electrically couple die in an electronic device package. Despite these advantages, however, the CUF technology is limited by finite dispensing dot size and placement accuracy. As a result, a KOZ between a top die edge and a bottom die edge on the order of 500 um is usually required. In many application cases, however, the total die area of the top die is very close to the bottom die area, leaving very little space between the top and the bottom die edges. Dispense dot size reduction and equipment alignment accuracy improvement can help to reduce the size of the dispense KOZ. But the run rate will be significantly lower because the same amount of underfill material is still needed and equipment upgrade is costly. As a result, there is a strong driver for an innovation to provide small spacing between top die edges as well as top die edge to bottom die edge while using the existing CUF process, material, and equipment.

Invention embodiments allow CUF material to be dispensed between the top die despite the fact that die-to-die spacing is much smaller than typical CUF dispense dot size. The present technology allows control of the spread of the epoxy on the die so that majority of the underfill material will flow downwardly between the top die into the die-to-wafer interconnect region by capillary force. The present technology provides two primary manners of accomplishing this: in one aspect, an underfill material funnel is created on top of dies to feed the CUF material into a desired location. In another aspect, an underfill material funnel is created within the walls of dies to feed the CUF material into a desired location. This technology allows standard dispense dot size and alignment accuracy without requiring a standard dispense "tongue" side, as has been required in previous practices.

The technology can achieve very tight or dense top die-to-die spacing and small top die edge to bottom die edge distance in a 3D die stacking package using the standard CUF process, material, and equipment.

Figure 1A:
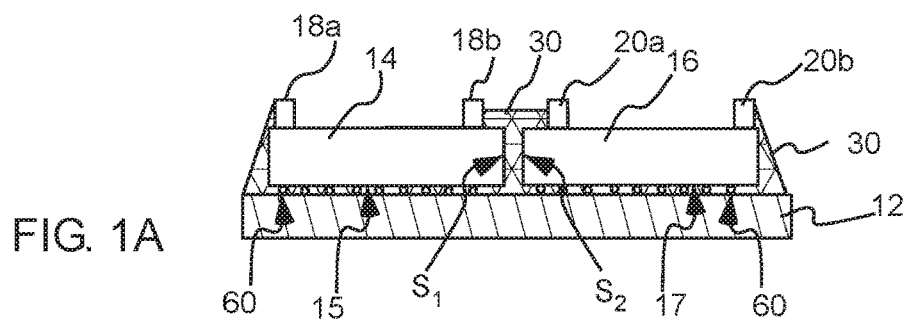
FIG. 1A is a cross-sectional view of the electronic package assembly of FIG. 1, taken along section 1A-1A of FIG. 1, after further processing of the assembly in accordance with an example embodiment.
Figure 1B:
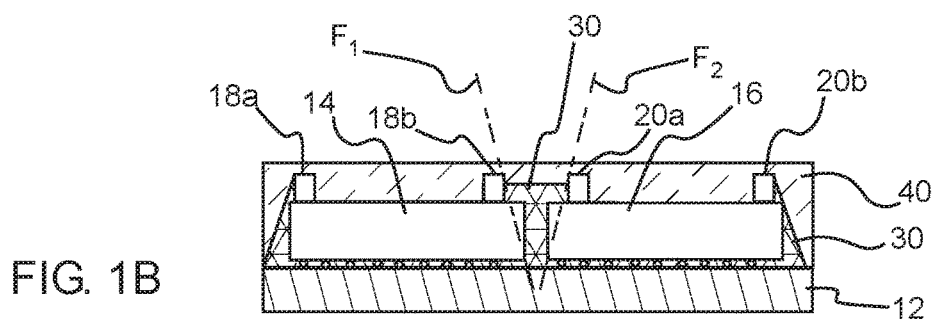
FIG. 1B is a cross-sectional view of the electronic package assembly of FIG. 1, taken along section 1A-1A of FIG. 1, after further processing of the assembly in accordance with an example embodiment.
Figure 1C:
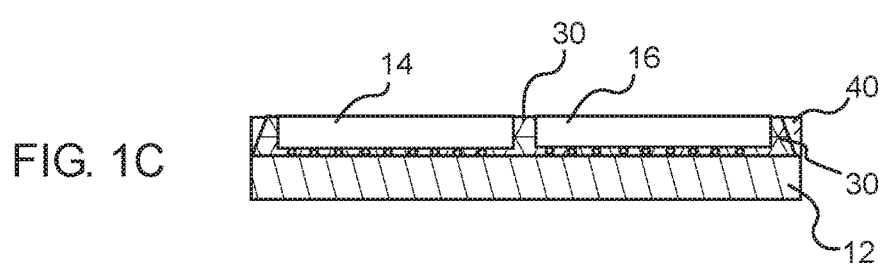
FIG. 1C is a cross-sectional view of the electronic package assembly of FIG. 1, taken along section 1A-1A of FIG. 1, after further processing of the assembly in accordance with an example embodiment.

With reference to FIGS. 1-1C, an electronic package assembly is shown generally at 100. The package assembly can include a substrate 12 that can have an upper surface area $A_1$. A first active die 14 can have an upper surface area $A_2$ and a bottom surface (15 in FIG. 1A). The bottom surface 15 of the first active die can be operably coupled to the substrate 12 by a variety of known techniques. A second active die 16 can have an upper surface area $A_3$ and a bottom surface (17 in FIG. 1A). The bottom surface of the second active can be operably coupled to the substrate 12 by a variety of known techniques.

The substrate 12 can take a variety of forms, and can be an electronically active or passive component. In one example, however, the substrate comprises an active die. The first 14 and second dies 16 and the substrate can each represent a discrete product or device formed of a semiconducting material, on which a functional circuit can be fabricated. The dies can be formed as is known in the art using semiconductor fabrication techniques such as thin film deposition, lithography, etching and the like used in connection with a variety of electronic devices. Each of the dies may include, or be a part of, a processor, computer memory, platform controller hub, etc. In one embodiment, each of the dies 12, 14, 16 can represent a discrete chip. The dies can be, include, or be a part of a processor, memory, system-on-a-chip (SoC) or application specific integrated circuit (ASIC).

One or more dies can be attached to a substrate 12 according to a variety of suitable configurations including a flip-chip configuration, wire bonding, and the like. The first 14 and/or second dies 16 can be electrically coupled to the substrate 12 (which can itself be a die) using a variety of known methods, including interconnect structures (not shown) configured to route electrical signals between the dies and the substrate. In some embodiments, the interconnect structure may be configured to route electrical signals such as, for example, I/O signals and/or power or ground signals associated with the operation of the dies 12, 14, 16. Note that, while two dies 14, 16 are shown, it is to be understood that more than or less than two dies can be provided.

The substrate 12 can take a variety of known forms and can include electrically conductive elements or electrical routing features (not shown) configured to route electrical signals to or from the dies 14, 16. The electrical routing features may be internal and/or external to the substrate 12. For example, in some embodiments, the substrate can include electrical routing features such as pads, bumps, through-silicon vias ("TSVs"), and/or traces configured to receive interconnect structures and route electrical signals to or from dies, and to or from an underlying circuit board, motherboard, etc., to which the substrate can be connected.

In the example of FIG. 1A, a capillary underfill material ("CUF" material) 30 can at least partially encapsulating the bottom surfaces 15, 17 of the first active die 14 and the second active die 16, and can extend upwardly upon inside side surfaces ($S_1$, $S_2$ in FIG. 1A) of the first 14 and second 16 active dies. In this example, a combined area of the upper surface area $A_2$ of the first active die and an upper surface area $A_3$ of the second active die can be at least about 90% of the upper surface area $A_1$ of the substrate. Due to the tight or dense die packing features of the present technology, the vast majority of the upper surface area $A_1$ of the substrate can be used to stack additional dies. In one example, 90% or more of this surface area $A_1$ is consumed by the top dies. In another example, 95% or more of this surface area $A_1$ is consumed by the top dies.

The present technology enables optimal usage of the available space atop the substrate 12 while utilizing conventional underfill technology. In one example, the top, first active die 14 and top, second active die 16 are attached atop the substrate 12 while separated by an inner gap $G_I$ (FIG. 1). Either die can be spaced from an edge of the substrate by a gap $G_O$ (shown in relation to die 16 in FIG. 1). In one example, gap $G_I$ can be about 200 μm or less. In one example, gap $G_I$ can be 100 μm or less. Similarly, gap $G_O$ can be about 200 μm or less. In one example, gap $G_O$ can be about 100 μm or less. By maintaining very small spacing between dies, and between die edges and edges of the substrate, a large percentage of the space available atop substrate 12 can be utilized (or the size of the substrate 12 can be reduced where desired, leading to significant cost savings).

The present technology achieves this advantage by applying one or more dam walls to dies to effectively enlarge the area in which underfill material can be applied. This is done by forming one or more dam walls in or on the top dies 14, 16. These dam walls can be formed on one die or both dies, and one or more dam walls can be applied to each die. The discussion below will focus on one or two dam walls formed on or in each die 14, 16. It is to be understood, however, that the technology is not so limited. Dam walls can be formed on or in each die adjacent to only one edge or side of the die, or two edges or sides, or all edges or sides. For example, in the embodiment illustrated in FIGS. 1-1C, first top die 14 includes two dam walls 18, 18a, formed on a top surface thereof. Second top die 16 includes two dam walls 20, 20a formed on a top surface thereof. However, each of these dies could include dam walls formed on each of four edges of each die, if desirable. In some examples, only a single dam wall is formed on or in each die.

In FIG. 1, die 14 includes dam wall 18b formed on a top thereof. Die 16 includes dam wall 20a formed on a top thereof. Each of these dam walls is positioned adjacent a side edge or side surface $S_1$, $S_2$, respectively, of each die. As shown schematically in FIG. 1B, each of the dam walls forms, or forms a part of, at least one surface of an underfill material funnel. Two such surfaces, $F_1$ and $F_2$, are shown for example in FIG. 1B. The funnel created by these two walls effectively enlarges the area into which underfill material 30, including CUF material, can be applied. Once applied, capillary action causes the material to wick beneath the dies, thereby underfilling the dies and covering solder beads 60.

By increasing the area into which the underfill material can be applied, the size of the gap $G_I$ can be reduced to a very small size, even if the underfill material being applied has a larger bead size than the gap $G_I$ (or gap $G_O$). In this manner, the underfill material 30 can be applied from the top surface of the die assembly, e.g., between upper side edges of the dies 14, 16.

The underfill material funnel (defined by surfaces $F_1$, $F_2$, FIG. 1B) can take a variety of forms. In the example shown in FIGS. 1-1B, the funnel surfaces are comprised of multiple surfaces that collectively slope inwardly relative to side edges of the dies. For example, funnel surface $F_1$ is defined by inside surface $S_1$ and an inside surface of dam wall 18b. Surface $F_1$ extends from an upper, inside corner of dam wall 18b to a lower, inside corner of die 14. Funnel surface $F_2$ is defined by inside surface $S_2$ and an inside surface of dam wall 20a. Surface $F_2$ extends from an upper inside corner of dam wall 20a and slopes downwardly toward a lower inside corner of die 16.

Thus, the dam walls or funnel surfaces $F_1$, $F_2$, need not be a continual, planar slope that progressively funnels toward a smaller opening. The funnel surfaces will generally, however, collectively and progressively taper from a larger opening near the topmost portion of the structure (e.g., between inside edges of the tops of dam walls) to a smaller opening near a lowermost portion of the structure (e.g., between inside bottom edges of the bottoms of the top dies). In some embodiments, all or some of the dam walls or funnel surfaces slope gradually and continuously along a planar surface. In other embodiments, a combination of surfaces collectively accomplishes this. In some embodiments, surfaces of the dam walls or funnel surfaces can be curved, arched, circular, etc. This can enable the walls to be formed using a variety of manufacturing techniques, including drilling, etching, carving, etc.

FIGS. 1A-1C illustrate various phases of one example of applying and utilizing the underfill material funnel structure of the present technology. In FIG. 1A, dam walls 18a, 18b have been formed on or in or attached to a top or upper surface of die 14. Dam walls 20a, 20b have been formed on or in or attached to a top or upper surface of die 16. The dam walls can be formed from a variety of materials, including without limitation silicon, solutions, ink and other materials typically used in the manufacture of integrated circuits. The dam walls can be physical barriers, as shown in the examples, or they can be surface energy barriers. Once the dam walls have been formed on or attached to the upper surface of the dies, an underfill material 30 can be applied to the assembly. In the example shown, the underfill material can advantageously be applied between the dam walls 18b and 20a (and thus into the underfill material funnel), and the material will be drawn under the dies and around solder beads 60.

Application of the underfill material 30 to outer side edges of the dies 14, 16 can be performed in much the same way. In this example, however, dam walls 18a and 20b, respectively, have been formed adjacent outer side edges of the dies. In this case, the dam walls form only one portion of a funnel structure used to apply the underfill material. Additional structure, which has been omitted from the present figures, can be added or used to enable operation of the outer dam walls 18a, 20b. In cases such as this (where underfill material is applied over side edges of the dies), a wall structure can be added near the outer side edge of substrate 12 to act as a "block" for the underfill material. Additionally, a trench (not shown) can be formed in the material used for the substrate 12 near the side edges of the substrate shown in FIG. 1B. The trench can serve to prevent underfill material from spreading beyond the bottom outside edges of the substrate.

After the underfill material has been applied, as shown in FIG. 1B, an encapsulant or molding 40 can optionally be added to the package. The encapsulant can be a variety of materials conventionally added to stacked 3D die assemblies, as is known in the art.

As shown in FIG. 1C, after the encapsulant has been added, the upper portions of the encapsulant can be removed along with portions of the dies 14, 16, as in conventional die assembly production. In addition, during this process or as an independent process, the dam walls 18a, 18b, 20a, 20b can be removed as well. It will be appreciated that, in this example, portions of the underfill material 30 remain and encapsulate the side surfaces of the dies as well as the bottom surfaces of the dies. While not so required, in one example the gap area defined in $G_I$ can be substantially completely filled by the underfill material.

It will also be appreciated from FIG. 1C that a segment of both the underfill material 30 and the molding or encapsulant 40 remains adjacent outer edges of the dies immediately above outer edges of the substrate 12. In one aspect, the underfill material extends into the outer gap substantially level with an upper surface of the first active die. This portion of the underfill can include a cross-section shaped as a truncated triangle. The upper, flat portion of this segment of material has been reduced to a plane during the process of removing the dam walls 18a, 18b, 20a and 20b (along with the adjacent portion of encapsulant and upper die surfaces). In this example, the remaining encapsulant material disposed adjacent the capillary underfill material in the outer gap $G_O$ includes a cross-section shaped as an inverted triangle.

While the dam walls 18a, 18b, 20a, 20b can be removed during this process, it is to be understood that one or more or all of the dam walls can remain atop the dies 14, 16 if so desired. In addition, while the dam walls are shown in the figures having a particular size and shape, this illustration is for exemplary purposes only. A single dam wall can, for example, be formed so as to extend across much of a top of one of the dies 14, 16. After further processing, this dam wall can remain in place and can serve some useful function in the finished product. For example, such a dam wall can be a metal slug that can remain in place after the package assembly is completed, the metal slug aiding in reducing warpage of the package, or as a heat sink, etc.

Figure 2:
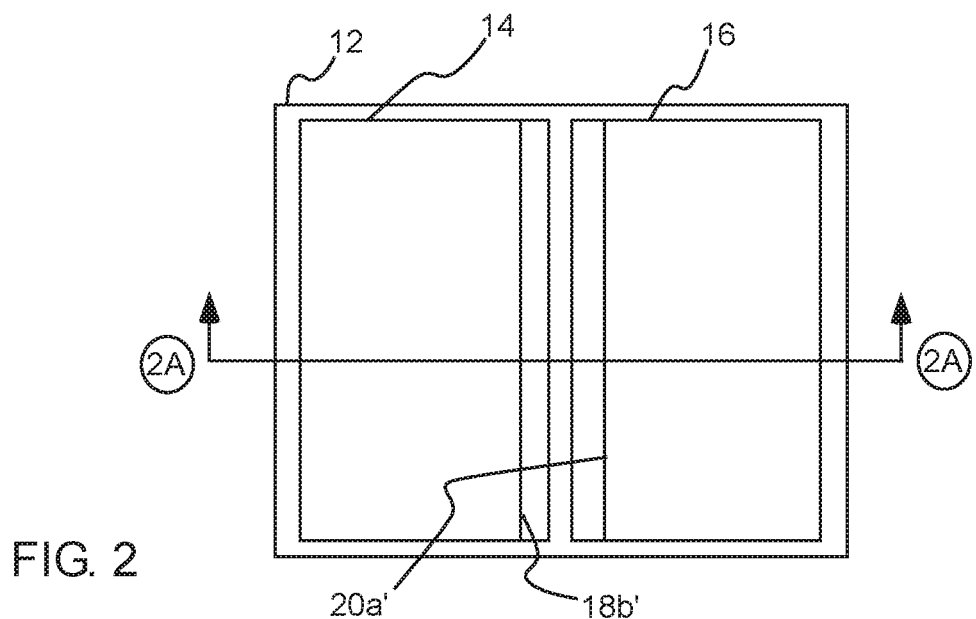
FIG. 2 is a top view of an electronic package assembly that will be used in further processing in accordance with an example embodiment.
Figure 2A:
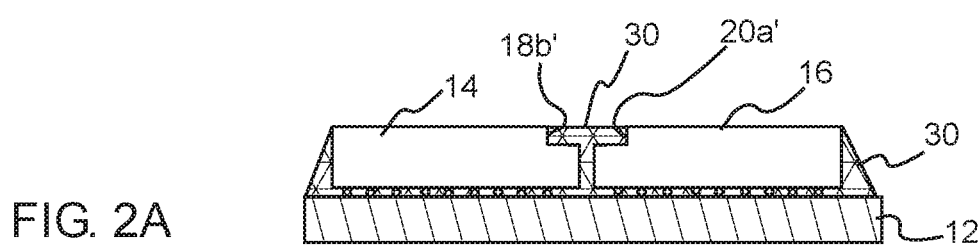
FIG. 2A is a cross-sectional view of the electronic package assembly of FIG. 1, taken along section 2A-2A of FIG. 2, after further processing of the assembly in accordance with an example embodiment.
Figure 2B:
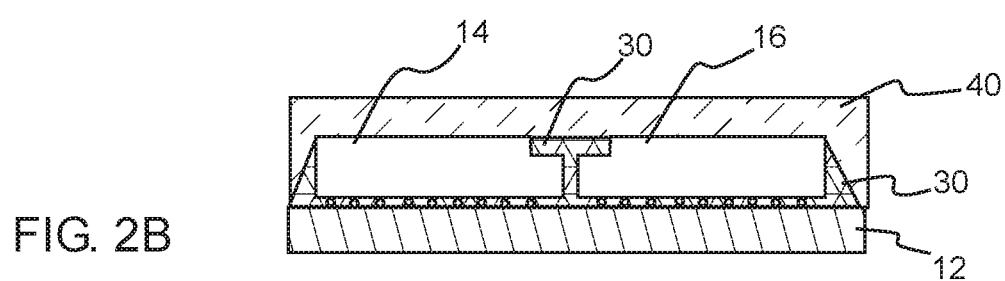
FIG. 2B is a cross-sectional view of the electronic package assembly of FIG. 1, taken along section 2A-2A of FIG. 2, after further processing of the assembly in accordance with an example embodiment.
Figure 2C:
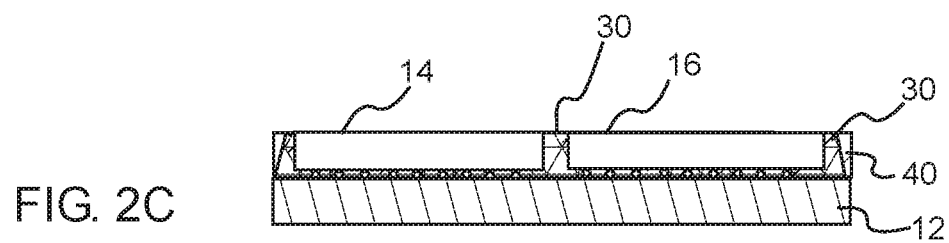
FIG. 2C is a cross-sectional view of the electronic package assembly of FIG. 1, taken along section 2A-2A of FIG. 2, after further processing of the assembly in accordance with an example embodiment.

FIGS. 2-2C illustrate another example in which dam walls 18b', 20a' have been formed in inner side edges of dies 14, 16, respectively. In this example, rectangular trenches have been formed in the dies using, for example, laser drilling, etching, etc. The dam walls function as previously described in the discussion relating to FIGS. 1-2C. FIGS. 2A-2C illustrate further process steps to achieve substantially the same finished product in the device of FIG. 2C as that of the device shown in FIG. 1C.

Figure 3:
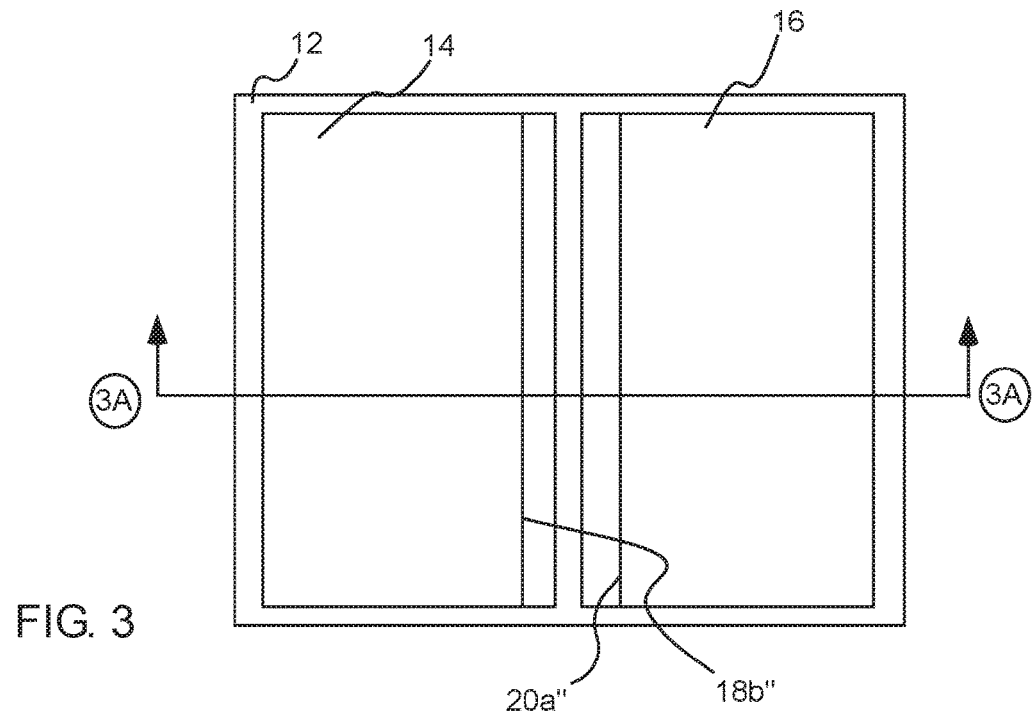
FIG. 3 is a top view of an electronic package assembly that will be used in further processing in accordance with an example embodiment.
Figure 3A:
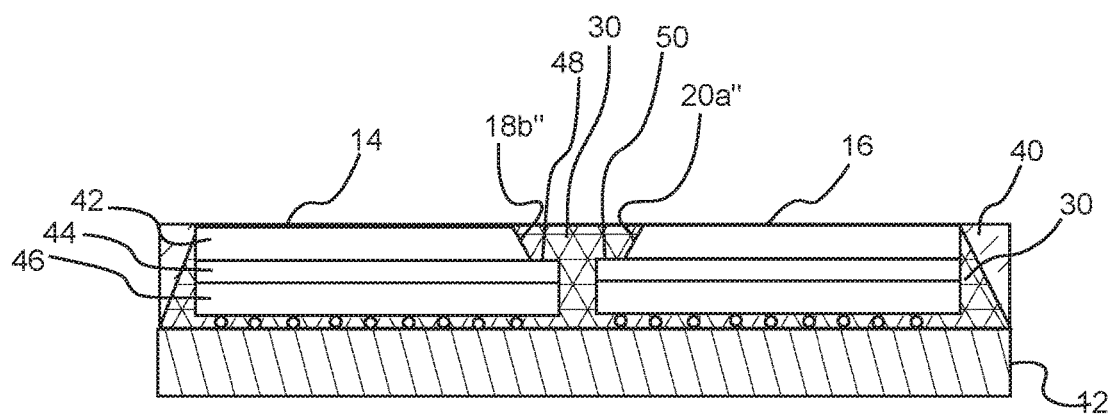
FIG. 3A is a cross-sectional view of the electronic package assembly of FIG. 1, taken along section 3A-3A of FIG. 1, after further processing of the assembly in accordance with an example embodiment.

FIGS. 3 and 3A illustrate another example in which dies 14 and 16 are each shown to include three primary layers: a lower, active transistor layer 46; an intermediate etch stop layer 44; and an upper silicon layer 42. Note that these layers are not necessarily drawn to scale—in particular, the etch stop layer is typically much thinner than the lower and upper layer. In this example, the dam walls 18b" and 20a" are formed in the silicon layer. The dam walls can be formed in a variety of manners, including without limitation laser processing (drilling), etching, etc. In this example, a portion 48, 50, respectively, of the etch stop layer from each die 14, 16 has been revealed aside each dam wall 18b", 20a". The encapsulant 30 can cover this revealed etch stop layer during the appropriate process phase.

Figure 4:
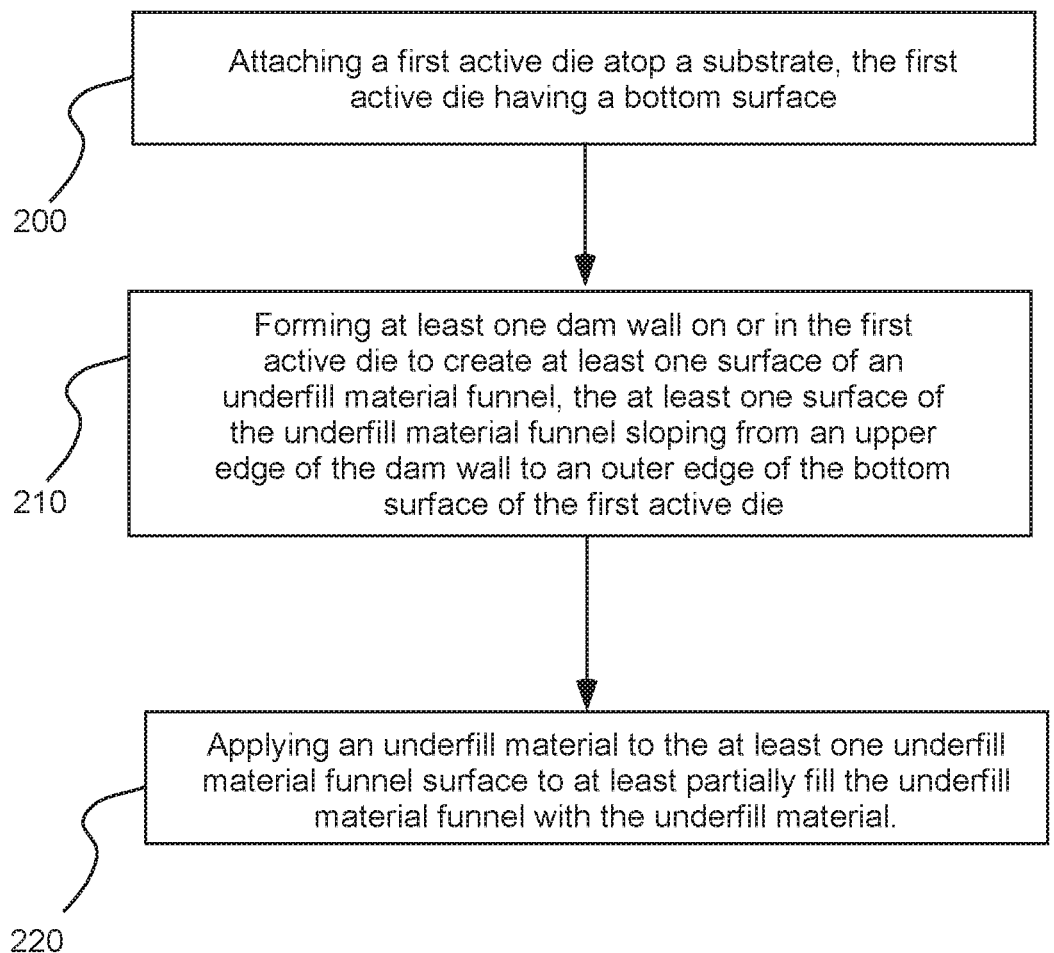
FIG. 4 is a flowchart illustrating an exemplary method in one example embodiment.
Figure 5:
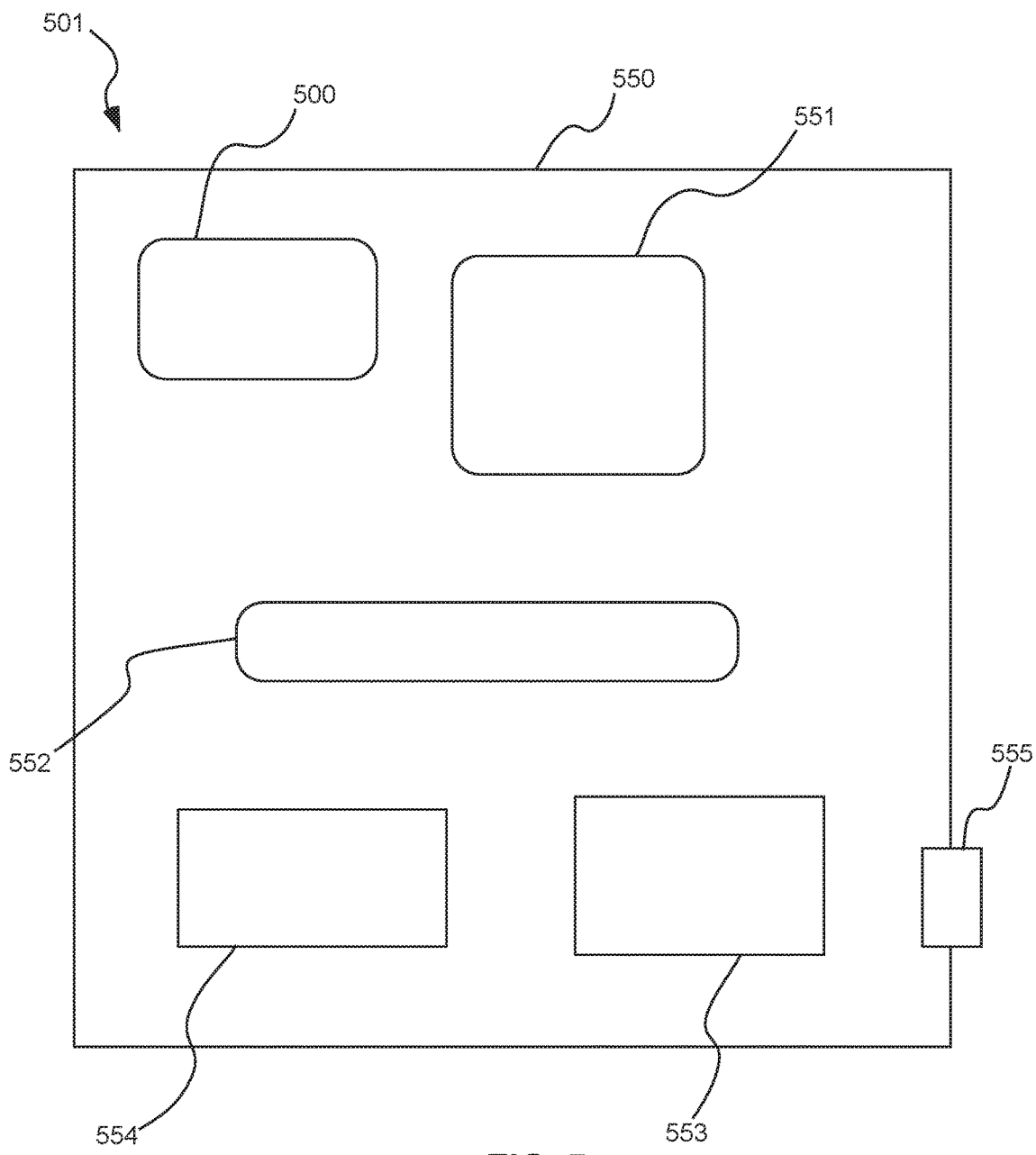
FIG. 5 is a schematic illustration of an exemplary computing system.

FIG. 4 illustrates an exemplary method of fabricating an electronic package assembly. At 200, the method can include attaching a first active die atop a substrate, the first active die having a bottom surface. At 210, at least one dam wall can be formed on or in the first active die to create at least one surface of an underfill material funnel. The at least one surface of the underfill material funnel can slope from an upper edge of the dam wall to an outer edge of the bottom surface of the first active die. At 220, an underfill material can be applied to the at least one underfill material funnel surface to at least partially fill the underfill material funnel with the underfill material FIG. 5 illustrates an example computing system 501. The computing system 501 can include an electronic package assembly 500 as disclosed herein, coupled to a motherboard 550. In one aspect, the computing system 501 can also include a processor 551, a memory device 552, a radio 553, a heat sink 554, a port 555, a slot, or any other suitable device or component, which can be operably coupled to the motherboard 550. The computing system 501 can comprise any type of computing system, such as a desktop computer, a laptop computer, a tablet computer, a smartphone, a wearable device, a server, various MEMs devices, etc. Other embodiments need not include all of the features specified in FIG. 5, and may include alternative features not specified in FIG. 5.

EXAMPLES

The following examples pertain to further embodiments.

In one example there is provided an electronic package assembly, comprising a substrate having an upper surface area. A first active die has an upper surface area and a bottom surface, the bottom surface operably coupled to the substrate. A second active die has an upper surface area and a bottom surface, the bottom surface operably coupled to the substrate. A capillary underfill material at least partially encapsulates the bottom surface of the first active die and the second active die and extends upwardly upon inside side surfaces of the first and second active dies. A combined area of the upper surface area of the first active die and an upper surface area of the second active die are at least about 90% of the upper surface area of the substrate.

In one example of an electronic package assembly, the combined area of the upper surface area of the first active die and an upper surface area of the second active die is at least about 95% of the upper surface area of the substrate.

In one example of a package assembly, the substrate comprises an active die.

In one example of an electronic package assembly, an inner gap is defined between adjacent inner sides of the first and second active dies, the inner gap being less than about 200 μm.

In one example of an electronic package assembly, the inner gap is less than about 100 μm.

In one example of an electronic package assembly, the capillary underfill material substantially fills the inner gap.

In one example of an electronic package assembly, the capillary underfill material is applied between adjacent edges of upper surfaces of the first and second active dies.

In one example of an electronic package assembly, an outer gap is defined between an outer side of the first active die and an outer side of the substrate, the outer gap being less than about 200 μm.

In one example of an electronic package assembly, the outer gap is less than about 100 μm.

In one example of an electronic package assembly, an encapsulant at least partially encapsulating the first active die, the second active die and the capillary underfill material.

In one example of an electronic package assembly, the first active die includes a lower transistor layer, an intermediate etch stop layer and an upper silicon layer, and the assembly further comprises a first dam wall formed in the silicon layer, the first dam wall creating at least one surface of an underfill material funnel, the at least one surface of the underfill material funnel sloping from an upper edge of the first dam wall to an outer edge of the bottom surface of the first active die.

In one example of an electronic package assembly, the second active die includes a lower transistor layer, an intermediate etch stop layer and an upper silicon layer, and further comprising a second dam wall formed in the silicon layer of the second active die, the second dam wall creating a second surface of the underfill material funnel, the second surface of the underfill material funnel sloping from an upper edge of the second dam wall to an outer edge of the bottom surface of the second active die.

In one example of an electronic package assembly, the underfill material funnel includes a larger opening defined between the upper edges of the first and second dam walls and a smaller opening defined between the outer edges of the bottom surfaces of the first and second active dies.

In one example of an electronic package assembly, the dam wall includes a planar surface.

In one example of an electronic package assembly, the dam wall includes a curved surface.

In one example of an electronic package assembly, a portion of the etch stop layer is revealed aside the first dam wall, and the assembly further comprises an encapsulant at least partially encapsulating the revealed portion of the etch stop layer.

In one example of an electronic package assembly, the first active die and the substrate each include an outer side separated from one another by an outer gap, and wherein the capillary underfill material adjacent the outer side of the first active die extends into the outer gap substantially level with an upper surface of the first active die.

In one example of an electronic package assembly, the capillary underfill material in the outer gap adjacent the outer side of the first active die has a cross-section shaped as a truncated triangle.

In one example of an electronic package assembly, an encapsulant is disposed adjacent the capillary underfill material in the outer gap, the encapsulant having a cross-section shaped as an inverted triangle.

In one example there is provided a computing system, comprising a motherboard and an electronic package assembly operably coupled to the motherboard. The electronic package assembly comprises a substrate having an upper surface area. A first active die has an upper surface area and a bottom surface, the bottom surface operably coupled to the substrate. A second active die has an upper surface area and a bottom surface, the bottom surface operably coupled to the substrate. A capillary underfill material at least partially encapsulates the bottom surface of the first active die and the second active die and extends upwardly upon inside side surfaces of the first and second active dies. A combined area of the upper surface area of the first active die and an upper surface area of the second active die are at least about 90% of the upper surface area of the substrate.

In one example of a computing system, the system comprises a desktop computer, a laptop, a tablet, a smartphone, a wearable device, a server, or a combination thereof.

In one example of a computing, the system comprises a processor, a memory device, a heat sink, a radio, a slot, a port, or a combination thereof operably coupled to the motherboard.

In one example of a computing system, the system comprises a plurality of electronic package assemblies operably coupled to the motherboard.

In one example there is provided a method of fabricating an electronic package assembly, comprising: attaching a first active die atop a substrate, the first active die having a bottom surface; forming at least one dam wall on or in the first active die to create at least one surface of an underfill material funnel, the at least one surface of the underfill material funnel sloping from an upper edge of the dam wall to an outer edge of the bottom surface of the first active die; and applying an underfill material to the at least one underfill material funnel surface to at least partially fill the underfill material funnel with the underfill material.

In one example of a method of fabricating an electronic package, forming the at least one dam wall comprises forming a dam wall on an upper surface of the first active die.

In one example of a method of fabricating an electronic package, the at least one dam wall is removed after applying the capillary underfill material to the material funnel surface.

In one example of a method of fabricating an electronic package, forming the at least one dam wall comprises forming the dam wall in a side of the first active die.

In one example of a method of fabricating an electronic package, the first active die includes a lower transistor layer, an intermediate etch stop layer and an upper silicon layer, and wherein forming the at least one dam wall comprises forming a dam wall in the silicon layer of the first active die.

In one example of a method of fabricating an electronic package, forming the at least one dam wall in the silicon layer includes revealing a portion of the etch stop layer, and further comprising applying an encapsulant to at least partially encapsulate the revealed portion of the etch stop layer.

In one example of a method of fabricating an electronic package, the underfill material includes a capillary underfill material.

In one example of a method of fabricating an electronic package, the method further comprises attaching a second active die atop the substrate, the second active die spaced from the first active die by an inner gap.

In one example of a method of fabricating an electronic package, the method further comprises forming at least one dam wall on or in the second active die.

In one example of a method of fabricating an electronic package, a combined area of an upper surface area of the first active die and an upper surface area of the second active die is at least about 90% of an upper surface area of the substrate.

In one example of a method of fabricating an electronic package, the inner gap is less than about 200 µm.

In one example of a method of fabricating an electronic package, the inner gap is less than about 100 µm.

In one example of a method of fabricating an electronic package, applying the underfill material comprises substantially filling the inner gap with the underfill material.

In one example of a method of fabricating an electronic package, applying the underfill material comprises applying the underfill material between adjacent edges of upper surfaces of the first and second active dies.

In one example of a method of fabricating an electronic package, the method further comprises forming at least one dam wall on or in the second active die such that the dam walls on the first and second active dies collectively define an underfill material funnel.

In one example of a method of fabricating an electronic package, the underfill material funnel includes a larger opening defined between upper edges of the first and second dam walls and a smaller opening defined between outer edges of bottom surfaces of the first and second active dies.

In one example of a method of fabricating an electronic package, the method further comprises applying an encapsulant to at least partially encapsulate the first active die, the second active die and the underfill material.

In one example of a method of fabricating an electronic package, the dam wall includes a planar surface.

In one example of a method of fabricating an electronic package, the dam wall includes a curved surface.

In one example of a method of fabricating an electronic package, the substrate comprises an active die.

In one example of a method of fabricating an electronic package, an outer gap is defined between an outer side of at least the first active die and an outer side of the substrate, and wherein the outer gap is less than about 200 µm.

In one example of a method of fabricating an electronic package, the outer gap is less than about 100 µm.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:
1. An electronic package assembly, comprising:
a substrate having an upper surface area;

a first active die having an upper surface area and a bottom surface, the bottom surface operably coupled to the substrate;

a second active die having an upper surface area and a bottom surface, the bottom surface operably coupled to the substrate; and a capillary underfill material, at least partially encapsulating the bottom surface of the first active die and the second active die and extending upwardly upon inside side surfaces of the first and second active dies;

a combined area of the upper surface area of the first active die and an upper surface area of the second active die being at least about 90% of the upper surface area of the substrate;

wherein either:

the electronic package assembly further comprises an encapsulant, at least partially encapsulating the first active die, the second active die and the capillary underfill material; or the first active die and the substrate each include an outer side separated from one another by an outer gap, and wherein the capillary underfill material adjacent the outer side of the first active die extends into the outer gap substantially level with an upper surface of the first active die.

2. The electronic package assembly of claim 1, wherein the combined area of the upper surface area of the first active die and an upper surface area of the second active die is at least about 95% of the upper surface area of the substrate.

3. The electronic package assembly of claim 1, wherein the substrate comprises an active die.

4. The electronic package assembly of claim 1, further comprising an inner gap defined between adjacent inner sides of the first and second active dies, and wherein the inner gap is less than about 200 μm.

5. The electronic package assembly of claim 4, wherein the inner gap is less than about 100 μm.

6. The electronic package assembly of claim 4, wherein the capillary underfill material substantially fills the inner gap.

7. The electronic package assembly of claim 1, wherein the capillary underfill material is applied between adjacent edges of upper surfaces of the first and second active dies.

8. The electronic package assembly of claim 1, further comprising an outer gap defined between an outer side of the first active die and an outer side of the substrate, and wherein the outer gap is less than about 200 μm.

9. The electronic package assembly of claim 8, wherein the outer gap is less than about 100 μm.

10. The electronic package assembly of claim 1, further comprising an encapsulant, at least partially encapsulating the first active die, the second active die and the capillary underfill material.

11. The electronic package assembly of claim 1, wherein the first active die and the substrate each include an outer side separated from one another by an outer gap, and wherein the capillary underfill material adjacent the outer side of the first active die extends into the outer gap substantially level with an upper surface of the first active die.

12. The electronic package assembly of claim 11, wherein the capillary underfill material in the outer gap adjacent the outer side of the first active die has a cross-section shaped as a truncated triangle.

13. The electronic package assembly of claim 12, further comprising an encapsulant disposed adjacent the capillary underfill material in the outer gap, the encapsulant having a cross-section shaped as an inverted triangle.

* * * * *